United States Patent
Cho et al.

(10) Patent No.: US 9,030,203 B2
(45) Date of Patent: May 12, 2015

(54) PORTABLE UNMANNED AIRSHIP FOR MAGNETIC-FORCE SURVEYING AND A MAGNETIC-FORCE SURVEYING SYSTEM EMPLOYING THE SAME

(75) Inventors: Seong-Jun Cho, Daejeon (KR); Jong-Sou Park, Koyang-Shi (KR); Gye-Soon Park, Gwacheon Si (KR)

(73) Assignee: Korea Institute of Geosciences & Mineral Resources, Daejeon (KR)

( * ) Notice: Subject to any disclaimer, the term of this patent is extended or adjusted under 35 U.S.C. 154(b) by 392 days.

(21) Appl. No.: 13/504,371

(22) PCT Filed: Oct. 29, 2009

(86) PCT No.: PCT/KR2009/006300
§ 371 (c)(1),
(2), (4) Date: Apr. 26, 2012

(87) PCT Pub. No.: WO2011/052822
PCT Pub. Date: May 5, 2011

(65) Prior Publication Data
US 2012/0212228 A1    Aug. 23, 2012

(30) Foreign Application Priority Data
Oct. 28, 2009    (KR) .................... 10-2009-0103016

(51) Int. Cl.
*G01V 3/16* (2006.01)
*G01R 33/038* (2006.01)
*B82Y 25/00* (2011.01)
*B64B 1/06* (2006.01)
*B64C 39/02* (2006.01)

(52) U.S. Cl.
CPC .............. *G01R 33/0385* (2013.01); *B64B 1/06* (2013.01); *B64C 39/024* (2013.01); *B64C 2201/022* (2013.01); *B64C 2201/127* (2013.01); *B82Y 25/00* (2013.01); *G01R 33/038* (2013.01)

(58) Field of Classification Search
None
See application file for complete search history.

(56) References Cited

U.S. PATENT DOCUMENTS

| 7,236,885 | B2 | 6/2007 | Macfarlane et al. |
| 2006/0041776 | A1 | 2/2006 | Agrawal et al. |
| 2009/0284258 | A1* | 11/2009 | Morrison et al. ............. 324/330 |

FOREIGN PATENT DOCUMENTS

| KR | 10-20080014104 | 2/2008 |
| WO | PCT/CA05/01557 A1 | 4/2006 |

OTHER PUBLICATIONS

WO2012051675A1 "Survey Airship" by Kroll Adam Apr. 26, 2012.*
International Search Report for PCT/KR2009/006300, (Nov. 18, 2010) Two Pages.

* cited by examiner

*Primary Examiner* — Paresh Patel
(74) *Attorney, Agent, or Firm* — Caesar Rivise, PC

(57) ABSTRACT

Disclosed are a portable unmanned airship for magnetic survey and a magnetic survey system using the same. The portable unmanned airship includes a fuselage using buoyancy of gas and propelled by motive power of the fuselage itself; an auto-flight unit automatically guiding the fuselage; a magnetometer disposed in the fuselage and measuring magnetic force of a stratum or a surface of the earth; a wireless communication unit transmitting magnetic data obtained by the magnetometer outside; and a control module controlling operations of the auto-flight unit and the magnetometer. With this configuration, it is possible to increase total operation time and a payload capacity of the unmanned airship.

6 Claims, 4 Drawing Sheets

PORTABLE UNMANNED AIRSHIP FOR MAGNETIC-FORCE SURVEYING AND A MAGNETIC-FORCE SURVEYING SYSTEM EMPLOYING THE SAME

TECHNICAL FIELD

The present invention relates to a portable unmanned airship for magnetic survey, which can determine geological structure or detect mineral resources based on magnetic force, and a magnetic survey system using the same.

BACKGROUND ART

Generally, magnetic survey is one of the most commonly used methods for determining geological structure or detecting mineral resources in mineral resource surveys.

In particular, aeromagnetic survey is the most basically used in survey of resources, and is applied not only to inspection of geological structure over wide areas, but also to direct survey of an iron mine, uranium mine or diamond mine.

Aeromagnetic survey is suited to survey of jungles, lakes, landmines or the like, where land survey is difficult.

A conventional aeromagnetic survey generally employs a helicopter or a fixed-wing airship, and techniques using an unmanned airship for magnetic survey have been developed in recent years.

One example of such techniques is disclosed in PCT/CA05/01557, entitled "UNMANNED AIRBORNE VEHICLE FOR GEOPHYSICAL SURVEY".

In this publication, an airplane is used to perform unmanned operation based on an unmanned aircraft and a magnetic force of geological stratum is measured using a magnetometer.

However, in the publication, a fuselage of the airplane and various components constituting the airplane are made of metallic materials, causing an increase in the total weight of the unmanned airplane.

As a result, there are problems in that the total operation time of the unmanned airplane is shortened, the airplane has a low payload capacity, magnetism can be generated in the airplane depending on ferruginous contents, and production costs become enormous in use of special lightweight and nonmagnetic alloys.

DISCLOSURE

Technical Problem

The present invention is conceived to solve such problems in the related art, and the present invention is aimed at providing a portable unmanned airship for magnetic survey, which may perform unmanned magnetic survey and has a decreased weight, and a magnetic survey system using the same.

The present invention is also aimed at providing a portable unmanned airship for magnetic survey, in which a magnetometer for measuring magnetic force may be stably operated by minimizing magnetic interference generated in the magnetometer, and a magnetic survey system using the same.

Technical Solution

In accordance with one aspect of the present invention, a portable unmanned airship for magnetic survey includes: a fuselage using buoyancy of gas and propelled by motive power of the fuselage itself; an auto-flight unit automatically guiding the fuselage; a magnetometer disposed in the fuselage and measuring magnetic force of a stratum or a surface of the earth; a wireless communication unit transmitting magnetic data obtained by the magnetometer outside; and a control module controlling operations of the auto-flight unit and the magnetometer.

The wireless communication unit may receive an external signal for controlling operation of the control module.

The fuselage may include a gasbag to be filled with gas, and a motive power unit for providing propelling force to the fuselage, and the motive power unit may be made of a non-magnetic material to prevent magnetic interference with the magnetometer.

The fuselage may include a gasbag to be filled with gas, and a motive power unit for providing propelling force to the fuselage, and the magnetometer may be disposed in the gasbag to be separated a certain distance from the motive power unit to prevent magnetic interference with the motive power unit. The control module may be an embedded system based on an operating system (OS).

In accordance with another aspect of the present invention, a magnetic survey system includes: a portable unmanned airship including a fuselage using buoyancy of gas and propelled by motive power of the fuselage itself, an auto-flight unit automatically guiding the fuselage, a magnetometer disposed in the fuselage and measuring magnetic force of a stratum or a surface of the earth, a wireless communication unit transmitting magnetic data obtained by the magnetometer outside, and a control module controlling operations of the auto-flight unit and the magnetometer; and a central controller including a central wireless communication unit to perform wireless communication with the wireless communication unit, and a control unit controlling the magnetic data received in the central wireless communication unit to be processed and displayed through a display unit.

Advantageous Effects

According to the present invention, the foregoing portable unmanned airship for magnetic survey and a magnetic survey system using the same have the following effects.

First, according to the present invention, the total weight of the unmanned airship may be reduced through a fuselage using buoyancy of gas and propelled by motive power of the fuselage itself. Thus, it is possible to increase operation time of the unmanned airship and a payload loaded into the airship.

Second, according to the present invention, the unmanned airship employs a gasbag, so that it can be easy to carry by removing gas from the gasbag.

Thus, it is advantageous that a user can easily carry the unmanned airship and easily accomplish aerial survey even abroad.

Third, according to the present invention, a motive power unit is made of a non-magnetic material, so that magnetic interference between the motive power unit and the magnetometer can be decreased, thereby enabling stable operation of the magnetometer.

Fourth, according to the present invention, the magnetometer is disposed in the gasbag, so that the magnetometer and the motive power unit are separated from each other, thereby minimizing magnetic interference between the motive power unit and the magnetometer.

DESCRIPTION OF DRAWINGS

The above and other aspects, features and advantages of the present invention will be more clearly understood from the following description of exemplary embodiments taken in conjunction with the accompanying drawings, in which.

BEST MODE

Exemplary embodiments of the present invention will be described in detail with reference to accompanying drawings.

The present invention may, however, be embodied in many different ways and should not be construed as being limited to the following embodiments. Rather, these embodiments are given to provide complete disclosure of the invention and to provide thorough understanding of the invention to those skilled in the art.

Figure 1:
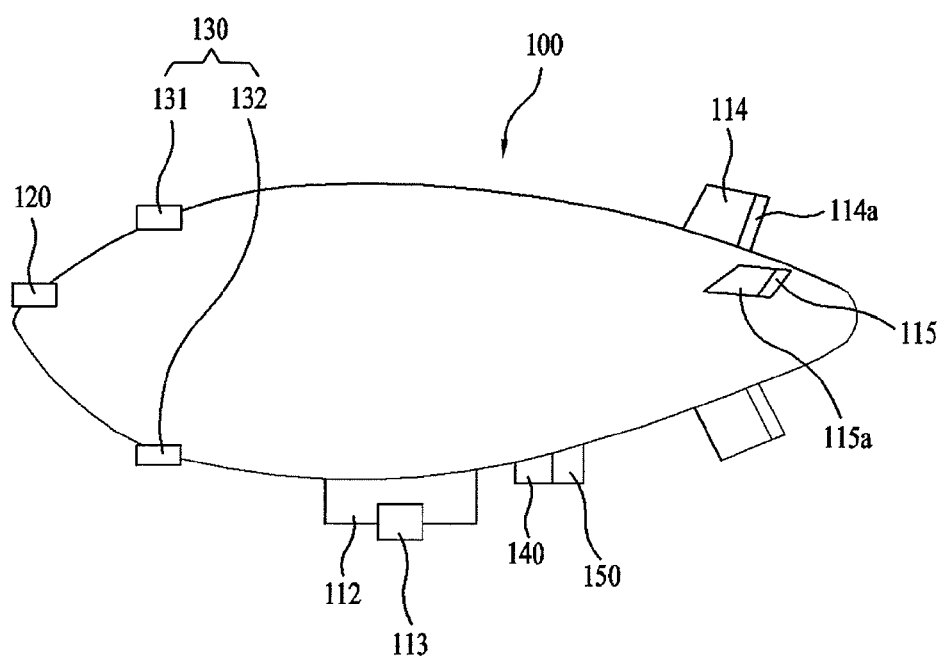
FIG. 1 is a side view of a portable unmanned airship for magnetic survey in accordance with one exemplary embodiment of the present invention.
Figure 2:
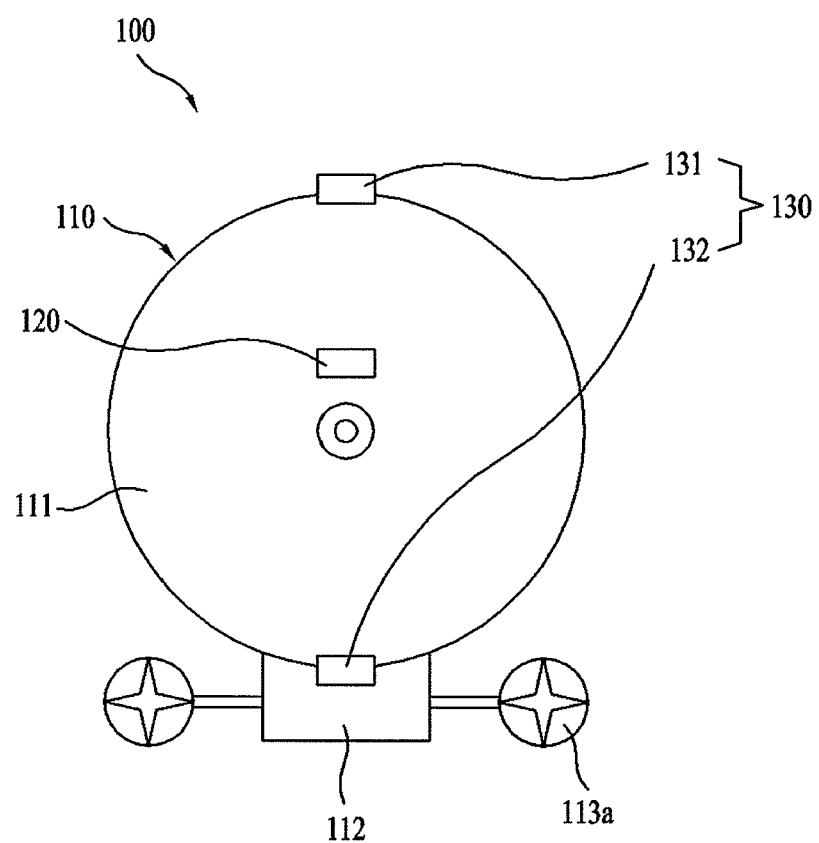
FIG. 2 is a front view of the portable unmanned airship for magnetic survey in accordance with the exemplary embodiment of the present invention.
Figure 3:
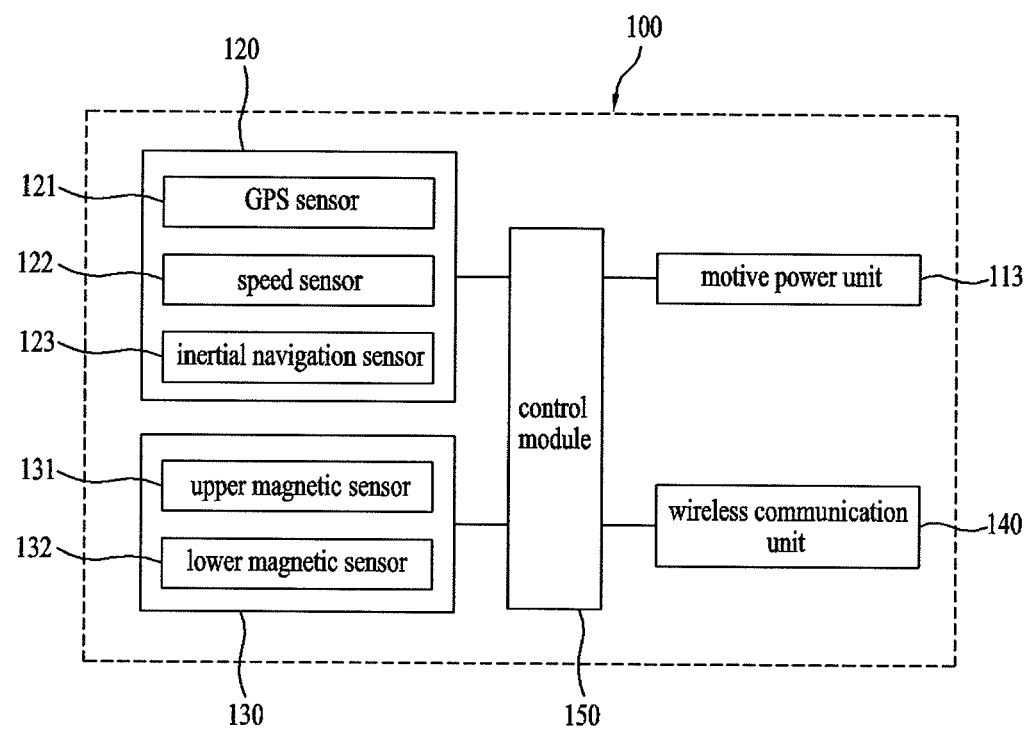
FIG. 3 is a block diagram of the portable unmanned airship for magnetic survey in accordance with the exemplary embodiment of the present invention.

FIGS. 1 and 2 are schematic views of a portable unmanned airship for magnetic survey according to one exemplary embodiment of the invention, and FIG. 3 is a block diagram of the portable unmanned airship for magnetic survey according to the exemplary embodiment of the invention.

Referring to FIGS. 1 to 3, the portable unmanned airship for magnetic survey according to the embodiment includes a fuselage 110, an auto-flight unit 120, a magnetometer 130, a wireless communication unit 140, and a control module 150.

The fuselage 110 includes a gasbag 111, a gondola 112, a motive power unit 113, a vertical empennage 114, and a horizontal empennage 115 such that it can use buoyancy of gas and be propelled by motive power of the fuselage itself.

The gasbag 111 is made of fiber, resin or the like, and is filled with gas, such as helium, etc., which has a lower specific gravity than air, thereby providing more buoyancy that the unmanned airship 100 needs.

The gondola 112 is disposed at a bottom side of the gasbag 111 and provides a space for loading a payload.

The motive power unit 113 provides propelling force to the fuselage 110, which includes a propeller 113a, and an engine (not shown) for supplying rotational force to the propeller 113a.

In this embodiment, the motive power unit 113 is disposed in the gondola 112. Alternatively, the motive power unit 113 may be disposed at a rear end, a front end or a lateral side of the gasbag 111.

The motive power unit 113 may be made of a non-magnetic material, such as aluminum, FRP (Fiber Reinforced Plastic) and the like, so as to prevent magnetic interference with the magnetometer 130. For example, components constituting the engine, the propeller 113a, and the like may be made of non-magnetic materials.

The motive power unit 113 according to the present invention is an engine type unit that is driven by combusting gasoline or the like, so that it can significantly reduce formation of a magnetic field, as compared with a battery type unit as a motive power source.

The vertical and horizontal empennages 113, 114 are disposed at the rear end of the gasbag 111, and are respectively provided with an elevator 114a and a rudder 115a to control a propelling direction and position of the fuselage 110.

The auto-flight unit 120 allows the unmanned airship 100 to automatically fly, and includes a GPS sensor 121 for measuring positioning information of the unmanned airship 100, such as flying positions, altitudes and the like, a speed sensor 122 for measuring a flying speed of the unmanned airship 100, and an inertial navigation sensor 123 for sensing angular velocity, acceleration, and the like of the unmanned airship 100.

Data measured by the GPS sensor 121, the speed sensor 122 and the inertial navigation sensor 123 are transmitted to the control module 150, which in turn controls operation of the elevator 114a, the rudder 115a, the motive power unit 113, and the like, based on the received data.

The magnetometer 130 measures magnetic force from a ground surface, stratum, underground media, the ocean floor, the lake bottom, etc. The magnetometer 130 is disposed in the gasbag 111 to be separated from the motive power unit 113, for example, by a distance of 3 to 4 m from the motive power unit 113, to prevent magnetic interference with the motive power unit 113.

The magnetometer 130 includes an upper magnetic sensor 131 disposed at an upper portion of the gasbag 111, and a lower magnetic sensor 132 disposed at a lower portion of the gasbag 111. The upper and lower magnetic sensors 131, 132 measure change in the intensity of magnetic force generated from mineral resources, such as an iron mine, uranium mine, diamond mine, etc., in the stratum.

The wireless communication unit 140 serves to transmit magnetic data obtained by the magnetometer 130 to the outside, and additionally transmits GPS information, position, altitude, velocity, angular velocity and acceleration information of the unmanned airship 100, as obtained by the auto-flight unit 120.

The control module 150 controls general operations of the auto-flight unit 120, the magnetometer 130, the motive power unit 113 and the wireless communication unit 140, which may be an embedded system based on an operating system (OS).

Further, the control module 150 may be controlled by an external control signal received by the wireless communication unit 140. Here, the external control signal refers to a control signal generated from a central controller 200 of a ground control center described below.

As such, the unmanned airship 100 according to the embodiment employs a gasbag 111, and it is thus easy to carry by removing gas filling the gasbag 111.

Accordingly, it is advantageous that a user can hand-carry the unmanned airship and easily accomplish aerial survey even abroad.

Figure 4:
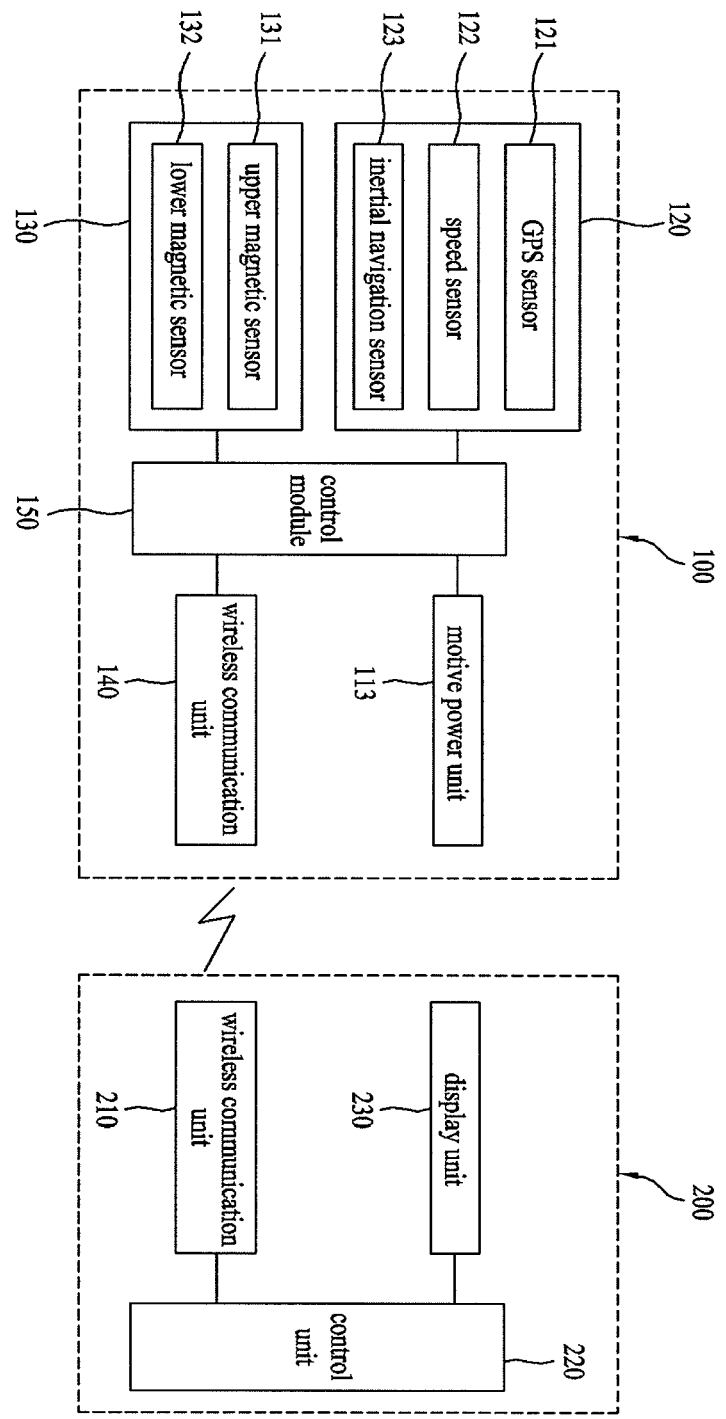
FIG. 4 is a block diagram of a magnetic survey system including a central controller and the portable unmanned airship for magnetic survey in accordance with one exemplary embodiment of the present invention.

FIG. 4 is a block diagram of a magnetic survey system including a central controller and the portable unmanned airship for magnetic survey according to one exemplary embodiment of the present invention.

Referring to FIG. 4, the magnetic survey system 300 according to the embodiment includes a portable unmanned airship 100 and the central controller 200.

The features of the foregoing embodiment may be equally applied to the portable unmanned airship 100 according to this embodiment and repeated descriptions thereof will be omitted.

The central controller 200 may be disposed in the ground control center or the like, and includes a central wireless communication unit 210, a control unit 220 and a display unit 230.

The central wireless communication unit 210 performs wireless communication with the wireless communication unit 140 of the unmanned airship 100. The central wireless communication unit 210 serves to receive magnetic data obtained by the magnetometer 130 of the unmanned airship 100 and may be embodied by a radio modem or the like.

The control unit 220 processes the magnetic data received by the central wireless communication unit 210 and allows progress in measured magnetism to be displayed through the display unit 230.

Here, the control unit 220 may generate a control signal for controlling operation of the control module 150 of the unmanned airship 100. The control signal generated by the control unit 220 is transmitted to the unmanned airship 100 via the central wireless communication unit 210 and then received by the wireless communication unit 140.

Further, the control unit 220 may receive GPS information, position, height, velocity, angular velocity and acceleration information of the unmanned airship 100, transmitted from the unmanned airship 100, through the central wireless communication unit 210, and display the information.

It will be appreciated that such technical configurations of the present invention can be embodied by those skilled in the art to which the present invention pertains in other specific forms without modifying the technical idea or essential characteristics thereof. Thus, the scope of the invention is defined by the following claims rather than the foregoing detailed description, and it should be interpreted that all modifications or changes from the meaning, scope and equivalents of the claims are included in the scope of the invention.

Some embodiments have been disclosed in the drawings and the specification. Although certain terms are used herein, they are merely intended to explain the present invention without limiting the meaning and the scope of the invention described in the claims. Therefore, it will be appreciated by those skilled in the art that various modifications and equivalent embodiments may be made in these embodiments. Accordingly, the scope of the invention will need to be defined in the accompanying claims.

INDUSTRIAL APPLICABILITY

According to the present invention, the foregoing a portable unmanned airship for magnetic survey and a magnetic survey system using the same have the following effects.

First, according to the present invention, the total weight of the unmanned airship may be reduced through a fuselage using buoyancy of gas and propelled by motive power of the fuselage itself. Thus, it is possible to increase operation time of the unmanned airship and a payload capacity of the airship.

Second, according to the present invention, the unmanned airship employs a gasbag, so that it can be easily carried by removing gas from the gasbag.

Thus, it is advantageous that a user can easily carry the unmanned airship and easily accomplish aerial survey even abroad.

Third, according to the present invention, a motive power unit is made of a non-magnetic material, so that magnetic interference between the motive power unit and the magnetometer can be decreased, thereby enabling stable operation of the magnetometer.

Fourth, according to the present invention, the magnetometer is disposed in the gasbag, so that the magnetometer and the motive power unit are separated apart from each other, thereby minimizing magnetic interference between the motive power unit and the magnetometer.

The invention claimed is:

1. A portable unmanned airship for magnetic survey, comprising:
    a fuselage using buoyancy of gas and propelled by motive power of the fuselage itself;
    an auto-flight unit automatically guiding the fuselage;
    a magnetometer disposed in the fuselage and measuring magnetic force of a stratum or a surface of the earth;
    a wireless communication unit transmitting magnetic data obtained by the magnetometer outside; and
    a control module controlling operations of the auto-flight unit and the magnetometer.

2. The portable unmanned airship according to claim 1, wherein the wireless communication unit receives an external signal for controlling operation of the control module.

3. The portable unmanned airship according to claim 1, wherein the fuselage comprises a gasbag to be filled with gas, and a motive power unit for providing propelling force to the fuselage, and the motive power unit is made of a non-magnetic material to prevent magnetic interference with the magnetometer.

4. The portable unmanned airship according to claim 1, wherein the fuselage comprises a gasbag to be filled with gas, and a motive power unit for providing propelling force to the fuselage, and the magnetometer is disposed in the gasbag to be separated a certain distance from the motive power unit to prevent magnetic interference with the motive power unit.

5. The portable unmanned airship according to claim 1, wherein the control module is an embedded system based on an operating system (OS).

6. A magnetic survey system using a portable unmanned airship, comprising:
    a portable unmanned airship comprising a fuselage using buoyancy of gas and propelled by motive power of the fuselage itself, an auto-flight unit automatically guiding the fuselage, a magnetometer disposed in the fuselage and measuring magnetic force of a stratum or a surface of the earth, a wireless communication unit transmitting magnetic data obtained by the magnetometer outside, and a control module controlling operations of the auto-flight unit and the magnetometer; and
    a central controller comprising a central wireless communication unit to perform wireless communication with the wireless communication unit, and a control unit controlling the magnetic data received in the central wireless communication unit to be processed and displayed through a display unit.

* * * * *